United States Patent [19]

Kumagai et al.

[11] Patent Number: 5,194,752
[45] Date of Patent: Mar. 16, 1993

[54] SEMICONDUCTOR MEMORY DEVICE

[75] Inventors: Jumpei Kumagai; Shizuo Sawada, both of Yokohama, Japan

[73] Assignee: Kabushiki Kaisha Toshiba, Kawasaki, Japan

[21] Appl. No.: 813,049

[22] Filed: Dec. 23, 1991

Related U.S. Application Data

[63] Continuation of Ser. No. 527,377, May 23, 1990, abandoned.

[30] Foreign Application Priority Data

May 23, 1989 [JP] Japan .................. 1-129916

[51] Int. Cl.⁵ .................. H01L 27/10; H01L 23/48
[52] U.S. Cl. .................. 257/390; 257/382
[58] Field of Search .................. 357/45, 23.7, 23.6, 357/41

[56] References Cited

U.S. PATENT DOCUMENTS

| | | | |
|---|---|---|---|
| 4,125,854 | 11/1978 | McKenny et al. | 357/41 |
| 4,291,391 | 9/1981 | Chatterjee et al. | 365/184 |
| 4,460,911 | 7/1984 | Salters | 357/23.6 |
| 4,476,547 | 10/1984 | Miyasaka | 357/23.6 |
| 4,649,406 | 3/1987 | Takemae | 357/23.6 |
| 4,700,328 | 10/1987 | Burghard | 361/51 |
| 4,710,897 | 12/1987 | Masuoka | 365/182 |
| 4,941,031 | 7/1990 | Kamagai et al. | 357/45 |

FOREIGN PATENT DOCUMENTS

| | | | |
|---|---|---|---|
| 0055572 | 7/1982 | European Pat. Off. | 357/23.5 |
| 61-274357 | 12/1986 | Japan | 357/23.5 |
| 63-278363 | 11/1988 | Japan | 357/23.6 |
| 64-80068 | 3/1989 | Japan | 357/23.5 |

OTHER PUBLICATIONS

International Electron Devices Meeting Technical Digest Dec. 11–14, 1988.

Primary Examiner—Andrew J. James
Assistant Examiner—Stephen D. Meier
Attorney, Agent, or Firm—Banner, Birch, McKie & Beckett

[57] ABSTRACT

For increasing pattern density of cell regions in a semiconductor memory device including an array of dynamic memory cells, the cell regions for cell transistor pairs are provided in a semiconductor substrate so as to be crossed by one desired bit line and two word lines adjacent thereto, and the patterns of cell regions have a same direction. Contacts for electrically connecting each bit line to common regions of cell transistor pairs are provided on respective bit lines every desired pitch at positions where each bit line intersects with cell regions. These contacts of adjacent bit lines are successively shifted in a bit line direction by approximately $\frac{1}{n}$ pitch (n is natural numbers greater than or equal to 2).

39 Claims, 8 Drawing Sheets

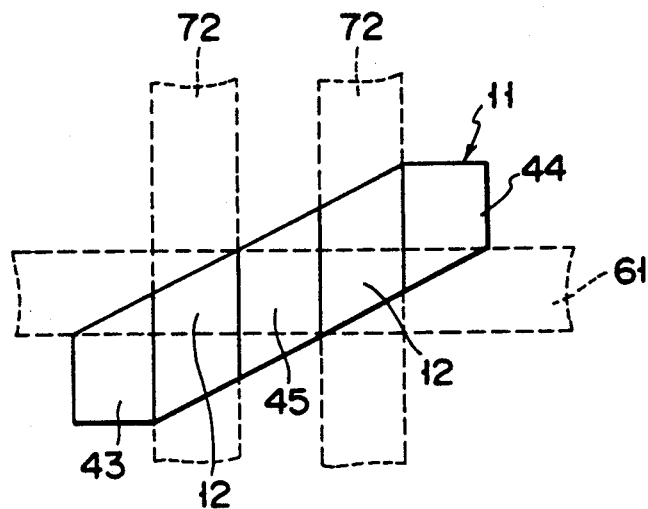
F I G. 3
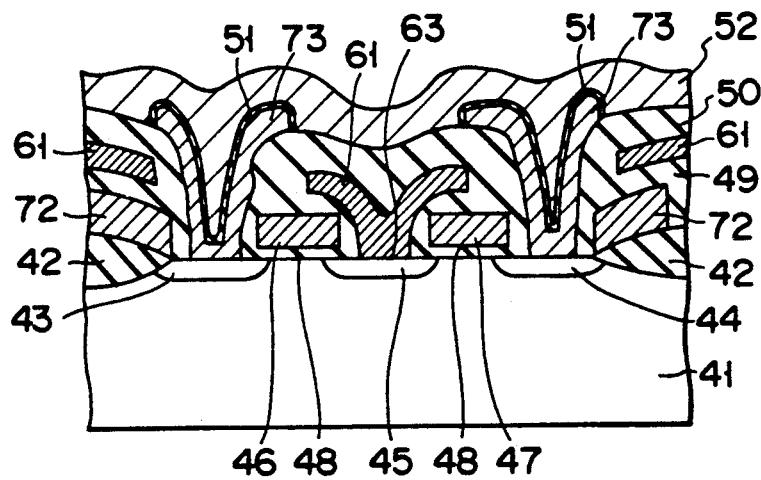
F I G. 4

SEMICONDUCTOR MEMORY DEVICE

This application is a continuation, of application Ser. No. 07/527,377 filed May 23, 1990 now abandoned.

BACKGROUND OF THE INVENTION

1. Field of the Invention

This invention relates to a semiconductor memory device, and more particularly to a cell array pattern in one-transistor.one-capacitor type dynamic memory cells.

2. Description of the Related Art

As an arrangement of a dynamic memory cell with a one-transistor.one-capacitor structure in a dynamic memory, various patterns have been proposed to increase the integration density thereof. FIG. 8 schematically shows an example of a conventional cell array pattern of folded bit line type. In FIG. 8, 61 denotes bit lines arranged in parallel with one another, and 62 denotes bit line sense amplifiers arranged on both sides of the bit lines 61. Adjacent two of the bit lines 61 make one complementary pair and are connected to a corresponding one of the bit line sense amplifiers 62. Each of the bit lines 61 has contacts or connection members 63 which are in contact with drain regions (or source regions) of memory cell transistors (charge transfer transistors) at desired pitch P in longitudinal direction thereof. In this case, if desired two bit lines adjacent to each other are noted, a position of a transistor contact 63 in one bit line 61 is deviated by ½ pitch in the bit line direction from a position of a transistor contact 63 of an adjacent bit line 61.

FIG. 9 shows part of the cell array pattern of FIG. 8 in detail. In FIG. 9, 61 denotes bit lines, 63 bit line contacts, 71a cell regions having a pattern extending diagonally right and upward, and 71b cell regions having a pattern extending diagonally right and downward, respectively. The two kinds of cell region patterns are alternately arranged every ½ pitch in the bit line direction. Further, 72 denotes word lines which are also used as gate electrodes of the cell transistors, 73 denotes capacitor storage electrodes provided for every memory cell, and 74 contacts (capacitor contacts) for connecting source regions 43 or 44 of cell transistors to the capacitor storage electrodes 73, respectively.

The cell regions 71a and 71b have a cross-sectional structure as shown in FIG. 4. In FIG. 4, 41 denotes a semiconductor substrate, 42 denotes a field insulating film for cell isolation selectively formed in the semiconductor substrate 41, 43 and 44 denote source regions of first and second cell transistors which are formed of diffused regions of a conductivity type opposite to that of the semiconductor substrate, 45 denotes a common drain region of the first and second cell transistors which is formed of a diffused region of a conductivity type opposite to that of the semiconductor substrate, and 46 and 47 denote the gate electrodes of the first and second cell transistors which are provided through a thin insulating film 48 above the semiconductor substrate 41 and used as part of the word lines 72. Further, 49 denotes a first interlevel insulator, 61 denotes the bit lines, 63 denotes the transistor contact which is in contact with the drain region 45 through a contact hole, 72 denotes the word lines and 50 denotes a second interlevel insulator.

The first and second cell transistors include a charge storage capacitor, respectively. That is, capacitor storage electrodes denoted by 73 ar partly disposed on the second interlevel insulator 50 so as to be located above part of the upper portion of the bit lines 61, and are in contact with the source regions 43 and 44 of the cell transistors via contact holes, respectively. A capacitor plate electrode 52 is provided so that the capacitor storage electrodes 73 are faced through a thin capacitor insulating film 51, thereby providing a stacked capacitor.

In the above cell array pattern, the bit lines 61 and the word lines 72 are arranged in respective directions to intersect with each other, the cell region 71a or 71b for two cell transistors is provided to cross one of the bit lines 61 and adjacent two of the word lines 72, respectively, each bit line 61 is in contact with the common region of the two cell transistors at the portion intersecting the bit line 61 and the cell region 71a or 71b, the capacitors are connected to the two cell transistors, and the cell regions 71a and 71b are provided with patterns which are inclined in the right-upward and right-downward directions, respectively, and are alternately arranged every ½ pitch in the bit line direction.

However, when the cell regions 71a and 71b are provided in this way, it is difficult to increase the integration density of the cell regions. That is, as shown in FIG. 9, the integration density of the cell regions is determined by the minimum distance d0 between the adjacent two patterns having different directions. The minimum distance dx between the adjacent two patterns having the same directions has a large space as compared to the minimum distance d0, thereby creating a uselessly unoccupied area.

As described above, since the conventional dynamic memory cells are provided by alternately arranging two kinds of patterns every ½ pitch as the cell regions, it is difficult to increase the integration density of cell regions.

SUMMARY OF THE INVENTION

Accordingly, an object of this invention is to provide a semiconductor memory device in which the pattern density of cell regions in cell array patterns of dynamic memory cell arrays is increased.

In a semiconductor memory device having one-transistor.one-capacitor type dynamic memory cells according to the invention, cell regions for cell transistor pairs are provided in a semiconductor substrate so as to be crossed by one bit line and two adjacent word lines, respectively, and the patterns of the cell regions have the same direction. Contacts are provided for electrically connecting respective bit lines and common regions of cell transistor pairs to one another at portions where the cell regions intersect with the bit lines ever desired pitch in the bit line direction. In this case, a distance between adjacent two contacts of a desired bit line is given as one pitch, and the contacts of the adjacent bit lines are shifted in the bit line direction by approximately $\frac{1}{n}$ pitch (n is natural numbers greater than or equal to 2).

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 3 is a plan view showing a pattern of source, channel and drain regions of a cell transistor pair in a cell region in FIG. 2;

FIG. 4 is a cross-sectional view of the memory cell region of FIGS. 2 and 9;

DETAILED DESCRIPTION OF THE PREFERRED EMBODIMENTS

There will now be described one embodiment of the invention with reference to the accompanying drawings.

Figure 1:
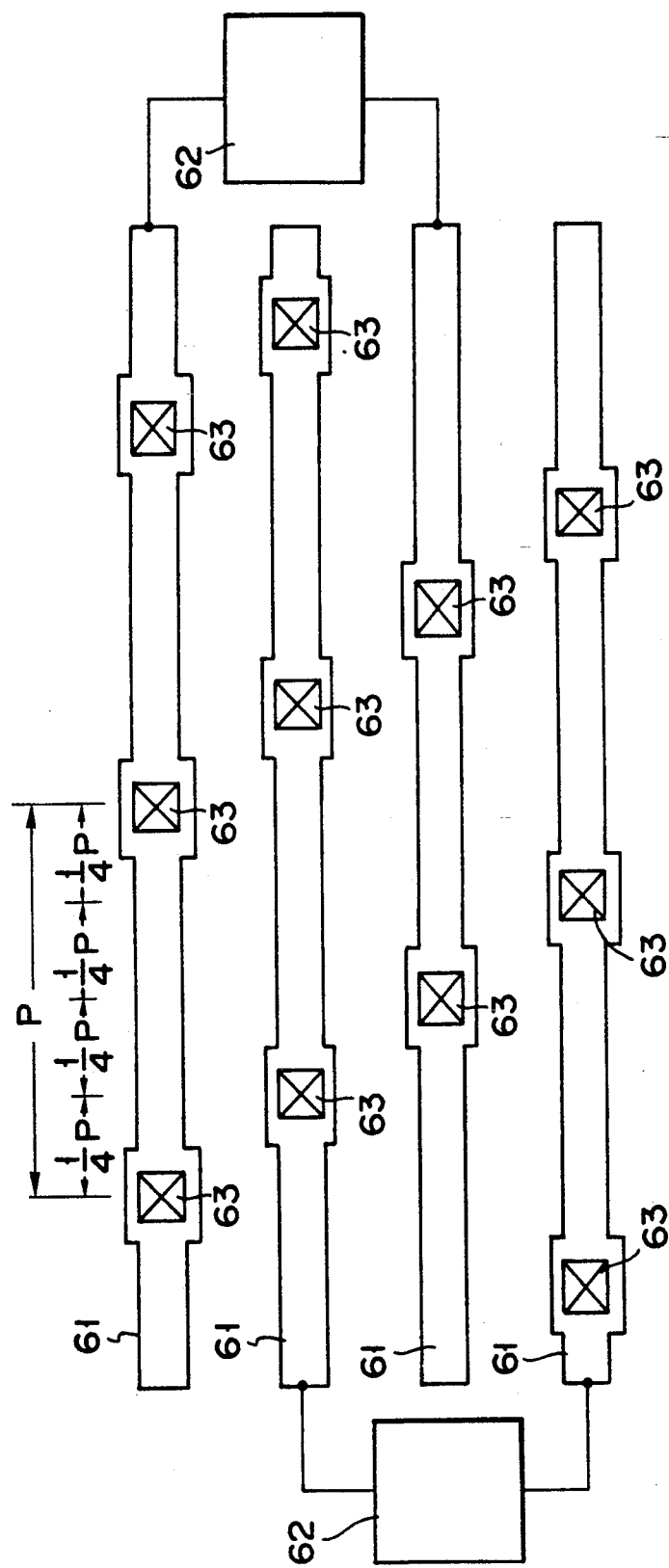
FIG. 1 is a plan view showing part of a cell array pattern of a semiconductor memory device according to one embodiment of the present invention.
Figure 2:
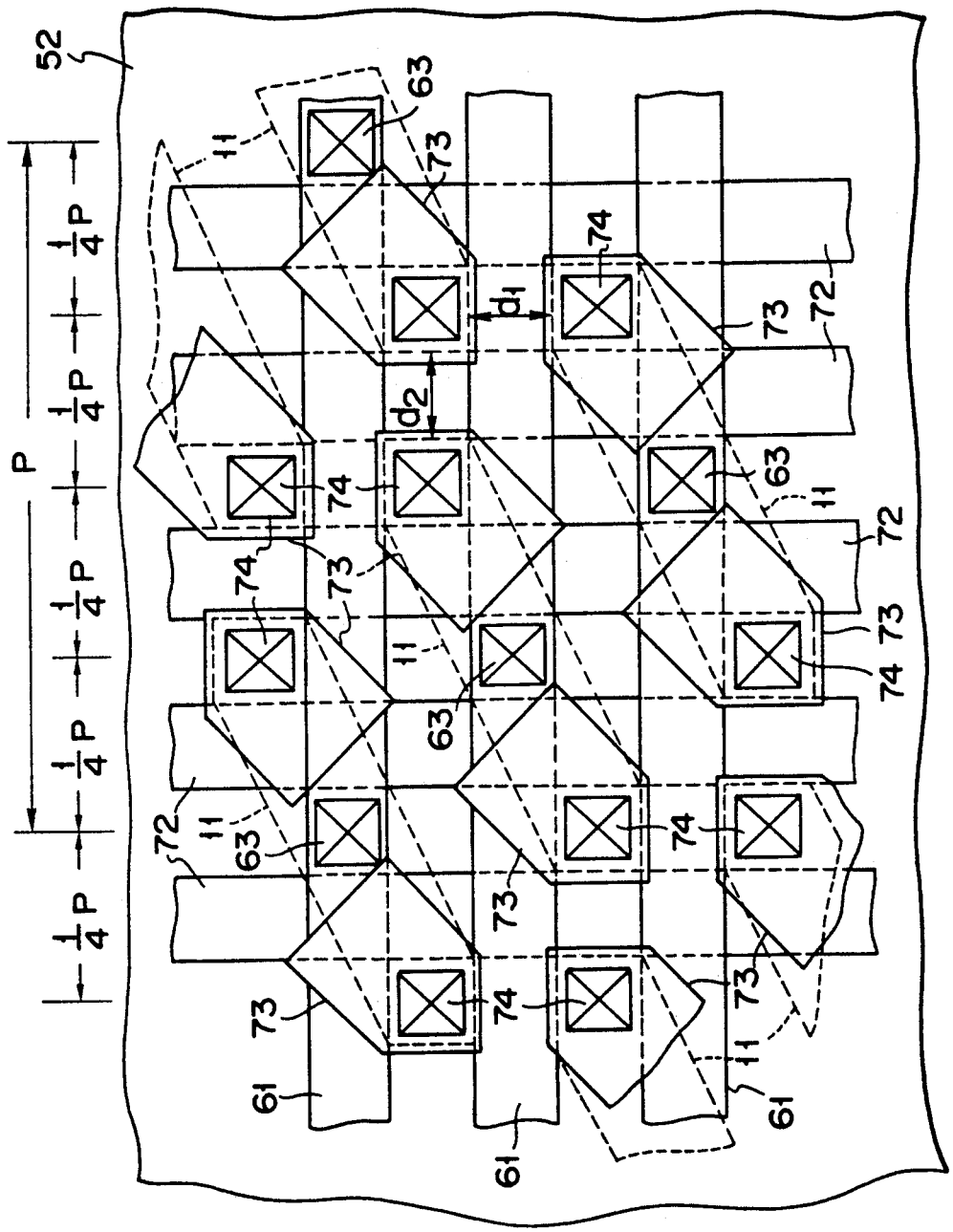
FIG. 2 is a plan view showing the part of the cell array pattern of FIG. 1 in detail.
Figure 8:
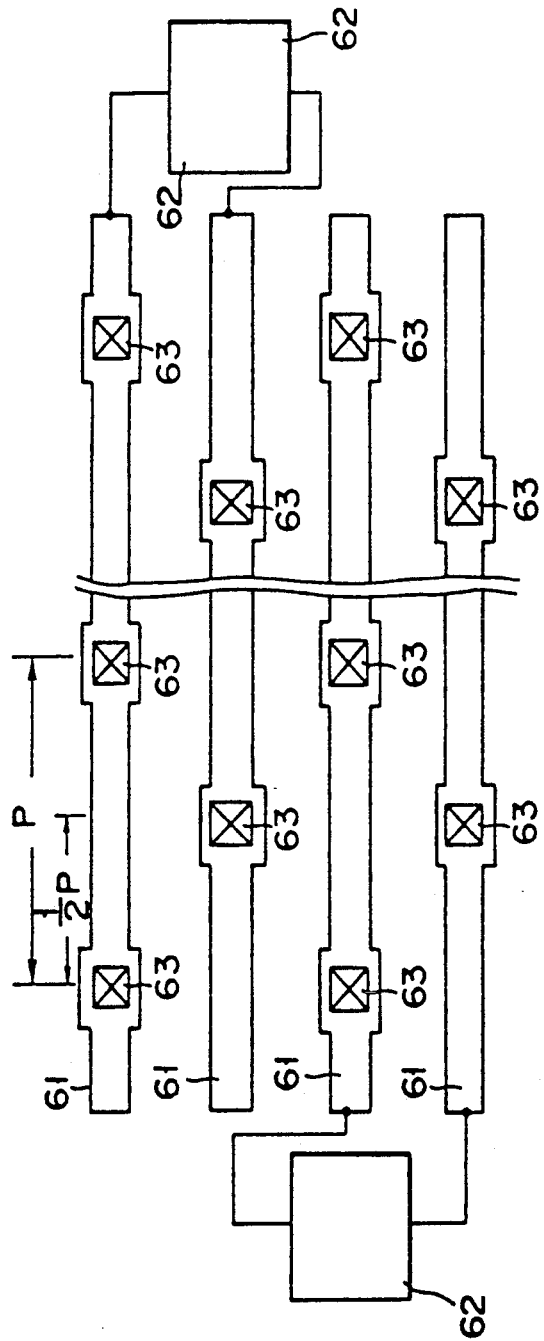
FIG. 8 is a plan view showing part of the cell array pattern in the conventional dynamic memory.

A cell array pattern of dynamic memory cells shown in FIGS. 1 and 2 is similar to that of the conventional dynamic memory cells explained with reference to FIGS. 8 and 9 except that respective transistor contacts 63 of adjacent bit lines 61 are shifted by approximately $\frac{1}{n}$ (for example, $\frac{1}{4}$) pitch in the bit line direction, and that the patterns of cell regions 11 extend in the same direction (that is, the patterns of cell regions 11 are of one kind).

FIG. 1 shows part of the cell array pattern of folded bit line type as an example of a cell array pattern of dynamic memory cells with a one-transistor.one-capacitor structure in a dynamic memory. That is, in FIG. 1, 61 denotes bit lines arranged in parallel with one another, 62 denotes bit line sense amplifiers arranged at both ends of the bit lines 61. A sense amplifier 62 is successively connected to a complementary pair arrangement which includes adjacent bit lines 61 between which another bit line 61 is disposed. Each of the bit lines 61 has contacts 63, which are in contact with drain regions (or source regions) of cell transistors, at a regular interval of constant pitch P in its bit line direction. In this case, a distance between adjacent two contacts of the bit line is given as one pitch. The contacts 63 of the bit lines 61 are successively deviated from contacts 63 of an adjacent bit lines 61 by $\frac{1}{4}$ pitch in the bit line direction.

FIG. 2 shows part of the cell array pattern of FIG. 1 in detail. The bit lines 61 and word lines 72 are arranged in directions to intersect with each other, and each cell region 11 for two cell transistors is provided so as to be crossed by one desired bit line 61 and adjacent two word lines 72, respectively. In this case, the respective patterns of the cell regions 11 extend in the same direction, and one kind of the cell region patterns are repeatedly arranged as a whole. Further, each of the bit lines 61 is in contact with a common region of two cell transistors every desired pitch in its longitudinal direction at portions intersecting with cell regions 11. The two cell transistors are provided so as to include two capacitors, thereby providing two dynamic memory cells with one-transistor.one-capacitor structure per one cell region.

In a plurality of bit lines 61 arranged in parallel with one another, the transistor contacts 63 of one of the bit lines 61 are successively deviated by approximately $\frac{1}{4}$ pitch in the bit line direction from the corresponding transistor contacts 63 of other bit lines 61 which are adjacent to the first bit line 61. Further, a capacitor storage electrode 73 is provided for every memory cell and is in contact with a corresponding cell transistor. The capacitor storage electrode 73 has an elongate pattern which overlaps the intersection of one bit line 61 and one word line 72. In FIG. 2, 74 denotes contacts between the source regions 43 or 44 of the cell transistors and the capacitor storage electrodes 73.

FIG. 3 shows a pattern of the source regions 43 and 44, channel regions 12 and drain region 45 of the cell transistor pair in the cell region 11 shown in FIG. 2.

Figure 9:
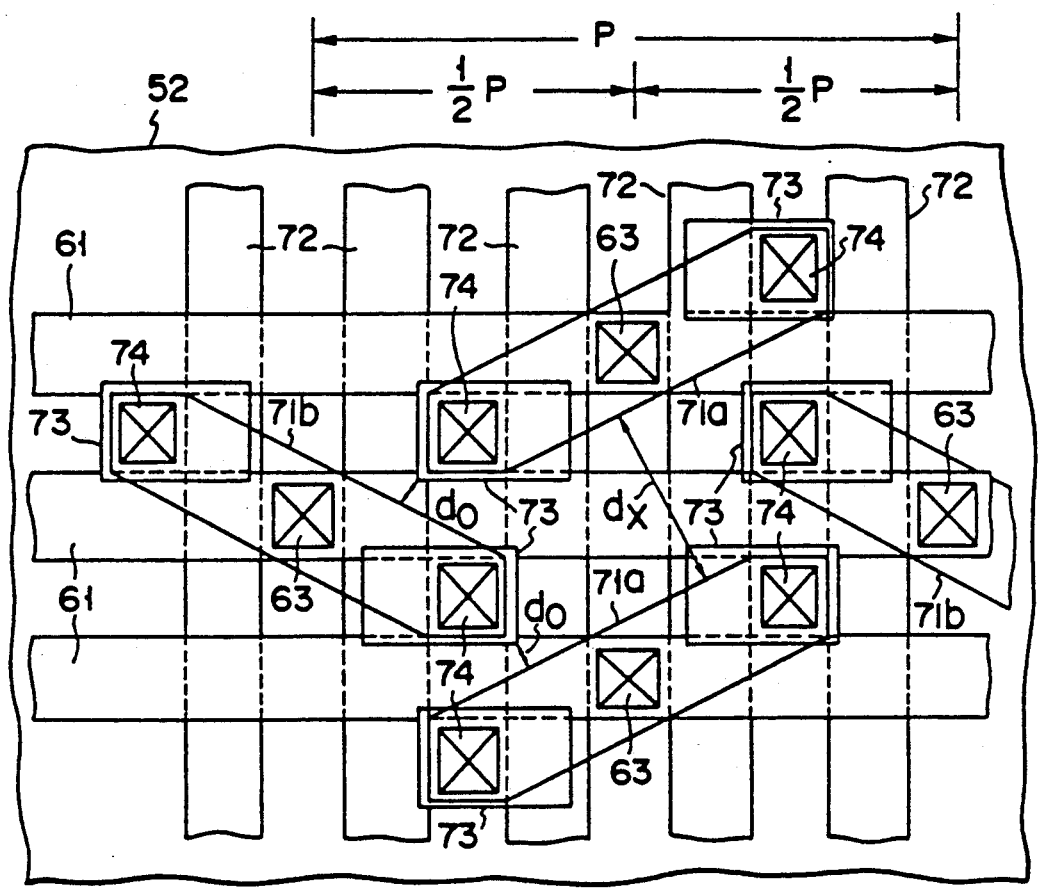
FIG. 9 is a plan view showing the part of the cell array pattern of FIG. 8.

The cross section of the memory cell region of FIG. 2 is substantially similar to the cross section of the memory cell region of the prior art shown in FIG. 9. That cross section is shown in FIG. 4. Referring to FIG. 4, 41 denotes a semicon-. In the drawing, 41 denotes a semiconductor substrate, 42 denotes a field insulating film for cell isolation selectively formed in the substrate, 43 and 44 denote the source regions of first and second cell transistors which are formed of diffused regions of a conductivity type opposite to that of the substrate, 45 denotes the common drain region of the first and second cell transistors which is formed of a diffused region of a conductivity type opposite to that of the substrate, and 46 and 47 denote the gate electrodes of the first and second cell transistors which are disposed on a thin gate insulating film 48 provided on the substrate 41 and which are part of the word lines 72, respectively. Further, 49 denotes a first interlevel insulator, 61 denotes the bit lines, and 63 denotes the transistor contact which is in contact with the drain region 45 through a contact hole, respectively. 72 denotes the word lines and 50 denotes a second interlevel insulator.

The first and second cell transistors include a charge storage capacitor, respectively. That is, capacitor storage electrodes denoted by 73 are partly disposed on the second interlevel insulator 50 so as to be located above part of the upper portion of the bit lines 61, and are in contact with the source regions 43 and 44 of the cell transistors through contact holes, respectively. A capacitor plate electrode 52 is provided so that the capacitor storage electrode 73 ar faced through a thin capacitor insulating film 51, thereby providing a stacked capacitor.

According to the cell array pattern described above, the cell regions 11 cross word lines 72 and extend so that the longitudinal axis of each cell is parallel to the longitudinal axis of each other cell. Furthermore, the axes may cross the lines in a non-perpendicular fashion. In this case, the integration density of the cell regions 11 is determined by the minimum distance d1 between the adjacent patterns in the word line direction or by the minimum distance d2 between the adjacent patterns in the bit line direction, and since a distance between adjacent patterns, which are deviated from each other by approximately $\frac{1}{4}$ pitch in the bit line direction, is reduced to of the order of the minimum distance d1 or d2, the density of the cell regions 11 can be increased, thereby further increasing the integration density thereof. Furthermore, a capacitor storage electrode 73 with increased area is provided. In addition, since the capacitor storage electrode 73 overlaps adjacent bit and word lines 61 and 72, unwanted stray capacitance between the bit lines 61 is minimized.

Figure 5:
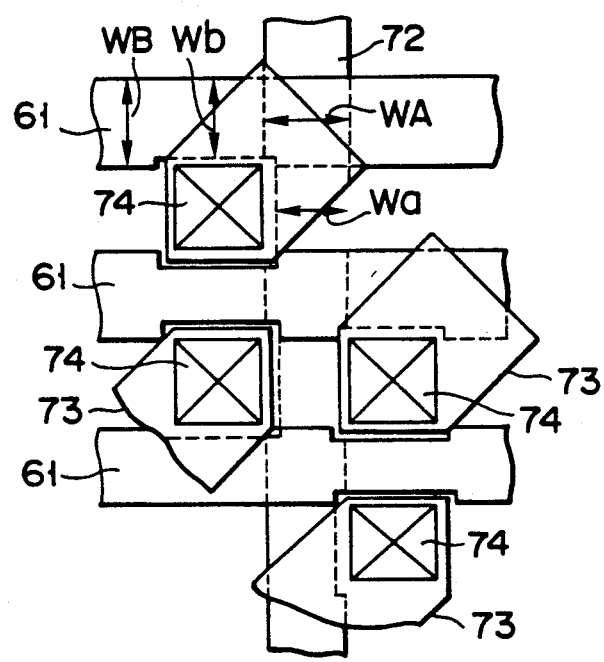
FIG. 5 is a plan view showing a modified example of word and bit line patterns near contacts of FIG. 2.

In order to obtain the sufficient area of each contact in the above embodiment, particularly, the sufficient area of each contact 74 between the source region 43 or 44 of the cell transistor and the capacitor storage electrode 73, the word line width Wa near the contact 74 may be made narrower than the word line width WA of the other portion thereof as shown in FIG. 5. Likewise, the bit line width Wb near each contact 74 may be made narrower than the bit line width WB of the other portion thereof.

Further, in the above embodiment, part of the capacitor storage electrode 73 is provided above part of the bit line 61, but it may be located below part of the bit line 61.

Next, another embodiment of the invention will be described.

Figure 6:
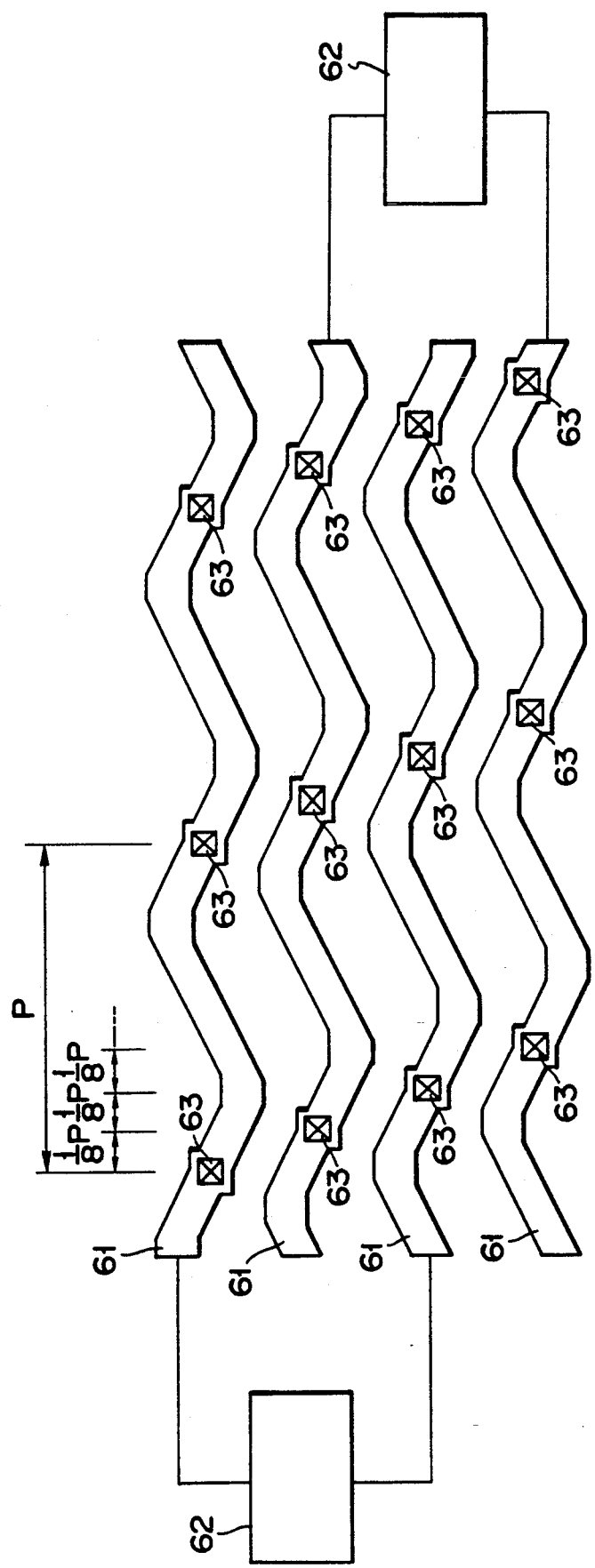
FIG. 6 is a plan view showing part of a cell array pattern of a semiconductor memory device according to another embodiment of the present invention.
Figure 7:
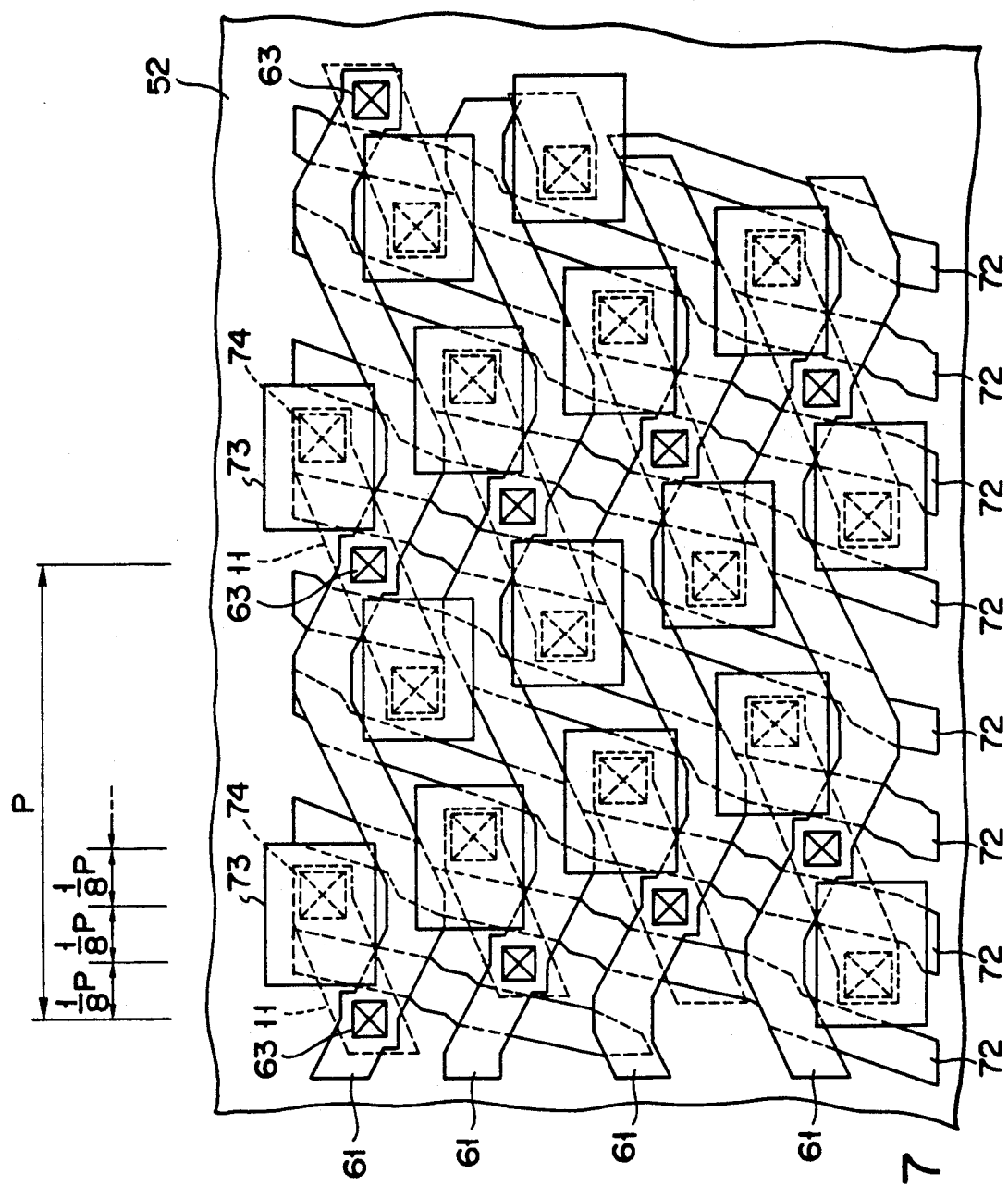
FIG. 7 is a plan view showing the part of the cell array pattern of FIG. 6.

FIGS. 6 and 7 show a cell array pattern of folded bit line type dynamic memory cells in which contacts of the adjacent bit lines are deviated from one another by ¼ pitch, and the same parts or components as those of FIG. 2 are denoted by the same reference numerals.

As shown in FIG. 6, a sense amplifier 62 is successively connected to both ends of bit lines which provide a complementary pair arrangement which includes adjacent bit lines 61 between which another bit line 61 is disposed. Each of the bit lines 61 has contacts 63, which are in contact with drain regions (or source regions) of cell transistors, at a regular interval of constant pitch P in its bit line direction. In this case, the contacts 63 of the bit lines 61 are successively deviated from contacts 63 of adjacent bit lines 61 by ¼ pitch in the bit line direction.

FIG. 7 shows part of the cell array pattern of FIG. 6 in detail.

As in the first embodiment of FIG. 2, in FIG. 7, the word lines 72 are insulatively disposed above the cell regions 11 formed in the semiconductor substrate, and the bit lines 61 are insulatively formed over the word lines. Also, the cell regions 11 are arrange to extend in the same direction. Each of the bit lines 61 are electrically connected to common regions of transistor pairs in cell regions 11 via the contacts 63, respectively. In this embodiment, the contacts 63 of adjacent bit lines 61 are deviated by ¼ pitch in the bit line direction from one another. An insulating film (not shown) is formed to cover the bit lines, and the capacitor storage electrodes 73 are provided on the insulating film. The storage electrodes 73 are connected to the source regions of corresponding cell transistors via the contacts 74. Further, capacitor plate electrodes 52 are disposed to face the storage electrodes 73 via an insulating film.

As described above, in this embodiment, the basic structure is the same as that of the first embodiment except that the contacts 63 of the adjacent bit lines 61 are deviated from one another by ¼ pitch in the bit line direction, and the pattern density of the cell regions can be further increased. Furthermore, as seen in FIG. 6, bit lines 61 may be arranged in a wave-like pattern, with each successive bit line "phase-shifted" from its adjacent bit line by an amount corresponding to the contact pitch shift. Similarly, as seen in FIG. 7, word lines 72 may be arranged in a wave-like pattern which also shifts with each successive word line. The word lines may be arranged in a non-perpendicular manner to the bit lines.

Further, this invention is not limited to the dynamic memory devices having the folded bit line type cell array pattern as described in the above embodiments, but can be applicable to dynamic memory devices using open bit line type cell array patterns.

It is further understood by those skilled in the art that the foregoing description is preferred embodiments of the disclosed devices and that various changes and modifications may be made in the invention without departing from the sprit and scope thereof.

What is claimed is:

1. A semiconductor memory device comprising:
a semiconductor substrate;
a plurality of bit lines arranged on said semiconductor substrate and extending generally in a first direction;
a plurality of word lines arranged on said semiconductor substrate and extending so as to intersect said bit lines;
a plurality of cell regions formed on said semiconductor substrate, each of said cell regions extending so as to be crossed by one of said bit lines and at least two adjacent word lines, and wherein each cell region on a portion of said substrate is respectively arranged to extend in a same direction; and
a plurality of memory cell pairs respectively formed in each of said cell regions, each of said memory cell pairs including first and second stacked capacitors having respective storage electrodes,
wherein each of said memory cell pairs includes a first contact coupled to said storage electrode of said first capacitor, a second contact coupled to the bit line crossing the associated cell region and a third contact coupled to said storage electrode of said second capacitor, said first and third contacts each being disposed at a region on said semiconductor substrate surrounded by two adjacent bit lines and two adjacent word lines, wherein successive of said second contacts of any one of said bit lines are separated by a predetermined pitch and the contacts of a first bit line are shifted by approximately $\frac{1}{n}$ pitch along said first direction from said contacts of a second adjacent bit line, and wherein n is a natural number greater than or equal to 2.

2. The semiconductor memory device according to claim 1, wherein each of said cell regions is crossed by one of said bit lines and at least two adjacent word lines non-perpendicularly.

3. The semiconductor memory device according to claim 1, wherein n is equal to 2.

4. The semiconductor memory device according to claim 1, wherein n is equal to 3.

5. The semiconductor memory device according to claim 4, wherein said bit lines and word lines are arranged in a wave-like pattern.

6. The semiconductor memory device according to claim 1, wherein each of said memory cell pairs includes two field effect transistors, each transistor comprising respective source and drain regions.

7. The semiconductor memory device according to claim 6, wherein one of said source and drain regions in each of said transistors comprises a common region.

8. The semiconductor memory device according to claim 7, wherein said second contact is coupled to said common region.

9. The semiconductor memory device according to claim 1, wherein said cell regions have parallel longitudinal axes and the longitudinal axis of each of said cell regions is crossed by one of said bit lines and at least two adjacent word lines.

10. The semiconductor memory device according to claim 9, wherein said longitudinal axis of each of said cell regions is crossed by one of said bit lines and said at least two adjacent word lines non-perpendicularly.

11. The semiconductor memory device according to claim 1, wherein said cell regions are surrounded by a field insulating film.

12. The semiconductor memory device according to claim 1, wherein each of said first and second stacked capacitors includes an insulating film provided on said storage electrode and a plate electrode formed on said insulating film.

13. The semiconductor memory device according to claim 1, wherein each of said storage electrodes has an elongated pattern which overlaps an intersection of a bit line and a word line.

14. The semiconductor memory device according to claim 13, wherein each storage electrode has a longitudinal axis different from a longitudinal axis of its associated cell region.

15. The semiconductor memory device according to claim 1, wherein a line width of at least one of said bit lines and word lines is made narrower in a portion near said storage electrode.

16. The semiconductor memory device according to claim 1, wherein a bit line sense amplifier is connected to ends of two bit lines so that said two bit lines provide a complementary pair arrangement.

17. The semiconductor memory device according to claim 1, wherein a portion of at least one of said first and third contacts is disposed so as to overlap at least one of said two adjacent bit lines.

18. The semiconductor memory device according to claim 1, wherein a portion of at least one of said first and third contacts is disposed so as to overlap at least one of said two adjacent word lines.

19. The semiconductor memory device according to claim 1, wherein a portion of at least one of said first and third contacts is disposed so as to overlap at least one of said two adjacent bit lines and at least one of said two adjacent word lines.

20. A semiconductor memory device comprising:
a semiconductor body;
M bit lines arranged on said semiconductor body;
N word lines arranged on said semiconductor body and intersecting said bit lines;
a first memory cell pair formed on said semiconductor body and having a first contact between an n and an (n+1) word line and an m and an (m+1) bit line, a second contact between an (n+2) and an (n+3) word line and the (m+1) and an (m+2) bit line, and a third contact at the (m+1) bit line;
a second memory cell pair formed on said semiconductor body and having a first contact between the (n+2) and the (n+3) word line and the (m+2) and an (m+3) bit line; and
a third memory cell pair formed on said semiconductor body and having a first contact between the (n+3) and an (n+4) word line and the (m+1) and the (m+2) bit lines.

21. The semiconductor memory device according to claim 20, wherein said N word lines extend in a first direction and the M bit lines extend in a second direction perpendicular to the first direction.

22. The semiconductor memory device according to claim 20, wherein a portion of at least one of said first contacts of said first, second and third memory cell pairs is disposed so as to overlap at least one of adjacent bit lines.

23. The semiconductor memory device according to claim 20, wherein a portion of at least one of said first contacts of said first, second and third memory cell pairs is disposed so as to overlap at least one of adjacent word lines.

24. A semiconductor memory device, comprising:
memory cell pairs, the memory cells of said memory cell pairs each including first and second terminal regions and having a storage electrode associated therewith;
word lines arranged to overlap channel regions defined by the first and second terminal regions of said memory cells;
bit lines arranged to intersect said word lines;
first contacts coupling said bit lines to the first terminal region of both memory cells of said memory cell pairs, wherein successive of said first contacts of any bit line are separated by a predetermined pitch and the first contacts of a first bit line are shifted by approximately $\frac{1}{n}$ pitch from the contacts of a second adjacent bit line, where n is a natural number greater than or equal to 2; and
second and third contacts respectively coupling the second terminal regions of each memory cell to its associated storage electrode, the second and third contacts of each memory cell pair having a bit line disposed therebetween.

25. The semiconductor memory device according to claim 24, wherein a portion of at least one of said second and third contacts is disposed so as to overlap at least one of adjacent bit lines.

26. The semiconductor memory device according to claim 24, wherein a portion of at least one of said second and third contacts is disposed so as to overlap at least one of adjacent word lines.

27. A semiconductor memory device formed on a substrate, comprising:
memory cell pairs, the memory cells of said memory cell pairs each including a transistor having first and second terminal regions and a capacitor having a storage electrode;
word lines arranged to overlap channel regions defined by the first and second terminal regions of said transistors;
a plurality of sense amplifiers;
a plurality of bit line pairs, each bit line pair comprising first and second bit lines connected to one of said sense amplifiers and arranged to intersect said word lines;
first contacts respectively coupling said bit lines to the first terminal region of both transistors of said respective memory cell pairs, wherein successive of said first contacts are separated by a predetermined pitch and the first contacts of a first bit line are shifted by approximately $\frac{1}{n}$ pitch from the contacts of a second adjacent bit line, where n is a natural number greater than or equal to 2;
second contacts coupling the second terminal of one transistor of each respective memory cell pair to its associated storage electrode; and
third contacts coupling the second terminal of the other transistor of each respective memory cell pair to its associated storage electrode, the second and third contacts of each respective memory cell pair having a bit line disposed therebetween.

28. The semiconductor memory device according to claim 27, wherein said bit line pairs comprise:
first and second bit lines; and
third and fourth bit lines, said third bit line being located between said first and second bit lines.

29. The semiconductor memory device according to claim 27, wherein a portion of at least one of said second and third contacts is disposed so as to overlap at least one of adjacent bit lines.

30. The semiconductor memory device according to claim 27, wherein a portion of at least one of said second and third contacts is disposed so as to overlap at least one of adjacent word lines.

31. A semiconductor memory device, comprising:
a semiconductor body of a first conductivity type;
word lines extending on said substrate and insulated therefrom;
bit lines intersecting said word lines and insulated therefrom;
a plurality of memory cells arranged in pairs, each memory cell including a transistor and a capacitor and each memory cell pair comprising:
first, second, and third impurity doped regions of a second conductivity type opposite to the first conductivity type formed in said semiconductor body, said first impurity doped region electrically connected to one of said bit lines, said first and second impurity doped regions and a respective portion of a first word line forming the transistor of one memory cell of said memory cell pair and said first and third impurity doped regions and a respective portion of a second word line different than the first word line forming the transistor of the other memory cell of said memory cell pair;
a first electrode connected to said second impurity doped region for forming a storage electrode of the capacitor of one memory cell of said memory cell pair; and
a second electrode connected to said third impurity doped region for forming a storage electrode of the capacitor of the other memory cell of said memory cell pair,
wherein successive connections of the first impurity doped regions of said memory cell pairs to a respective bit line are separated by a predetermined pitch and the connections to a first bit line are shifted by approximately $\frac{1}{n}$ pitch from the connections to a second adjacent bit line, where n is a natural number greater than or equal to 2, and
a bit line is disposed between the connection of the first storage electrode to the second impurity doped region and the connection of the second storage electrode to third impurity doped region of each memory cell pair.

32. The semiconductor memory device according to claim 31, wherein said second and third impurity diffused regions comprise source regions and said first impurity diffused region comprises a drain region common to the transistors of said memory cell pair.

33. The semiconductor memory device according to claim 31, wherein said word lines include first word line portions having a first width WA and second word line portions having a second width Wa smaller than the first width WA, said second word line portions located near connections of said second and third impurity diffused regions to said storage electrodes.

34. The semiconductor memory device according to claim 31, wherein said bit lines include first bit line portions having a first width WB and second bit line portions having a second width Wb smaller than the first width WB, said second bit line portions located near connections of said second and third impurity diffused regions to said storage electrodes.

35. The semiconductor memory device according to claim 31, wherein said bit lines comprises folded bit lines.

36. The semiconductor memory device according to claim 35, wherein the connections to a first bit line are shifted by approximately $\frac{1}{4}$ pitch from the connections to a second adjacent bit line.

37. The semiconductor memory device according to claim 31, wherein each memory cell includes a transistor and a stacked capacitor.

38. The semiconductor memory device according to claim 31, further comprising:
an insulating film on said first and second storage electrodes; and
a plate electrode on said insulating film.

39. The semiconductor memory device according to claim 31, further comprising:
a first sense amplifier connected to first and second bit lines; and
a second sense amplifier connected to third and fourth bit lines,
wherein said third bit line is disposed between said first and second bit lines.

* * * * *

UNITED STATES PATENT AND TRADEMARK OFFICE
CERTIFICATE OF CORRECTION

PATENT NO. : 5,194,752
DATED : March 16, 1993
INVENTOR(S) : Jumpei Kumagai, et. al.

It is certified that error appears in the above-indentified patent and that said Letters Patent is hereby corrected as shown below:

```
Column 9,  Claim 31, line 17,     "substrate" should be --semiconductor body--.
Column 10, Claim 32, lines 9-10,  "diffused" should be --doped--.
Column 10, Claim 32, line 11,     "diffused" should be --doped--.
Column 10, Claim 33, line 19,     "diffused" should be --doped--.
Column 10, Claim 34, line 26,     "diffused" should be --doped--.
```

Signed and Sealed this

Twenty-first Day of December, 1993

*Attest:*

BRUCE LEHMAN

*Attesting Officer*     *Commissioner of Patents and Trademarks*